(12) United States Patent
Martinis

(10) Patent No.: US 11,557,709 B2
(45) Date of Patent: Jan. 17, 2023

(54) FLEXIBLE WIRING FOR LOW TEMPERATURE APPLICATIONS

(71) Applicant: Google LLC, Mountain View, CA (US)

(72) Inventor: John Martinis, Santa Barbara, CA (US)

(73) Assignee: Google LLC, Mountain View, CA (US)

( * ) Notice: Subject to any disclaimer, the term of this patent is extended or adjusted under 35 U.S.C. 154(b) by 387 days.

(21) Appl. No.: 16/616,733

(22) PCT Filed: Sep. 7, 2017

(86) PCT No.: PCT/US2017/050504
§ 371 (c)(1),
(2) Date: Nov. 25, 2019

(87) PCT Pub. No.: WO2019/050525
PCT Pub. Date: Mar. 14, 2019

(65) Prior Publication Data
US 2021/0028346 A1   Jan. 28, 2021

(51) Int. Cl.
*H01L 39/24* (2006.01)
*G06N 10/00* (2022.01)
(Continued)

(52) U.S. Cl.
CPC ........... *H01L 39/248* (2013.01); *G06N 10/00* (2019.01); *H01B 7/0861* (2013.01);
(Continued)

(58) Field of Classification Search
CPC .. H01B 7/04; H01B 7/08; H01B 12/16; H01L 23/5387; H01L 39/248; H01L 39/2403;
(Continued)

(56) References Cited

U.S. PATENT DOCUMENTS 5,296,651 A    3/1994 Gurrie et al.
5,375,321 A   12/1994 Rohatgi et al.
(Continued)

FOREIGN PATENT DOCUMENTS

CN    101433132    5/2009
CN    107079579    8/2017
(Continued)

OTHER PUBLICATIONS

Individual single-wall carbon nanotubes as quantum wires. Sander J. Tans et al. (Year: 1997).*

(Continued)

*Primary Examiner* — Vibol Tan
(74) *Attorney, Agent, or Firm* — Fish & Richardson P.C.

(57) ABSTRACT

The subject matter of the present disclosure may be embodied in devices, such as flexible wiring, that include: an elongated flexible substrate; multiple electrically conductive traces arranged in an array on a first side of the elongated flexible substrate; and an electromagnetic shielding layer on a second side of the elongated flexible substrate, the second side being opposite the first side, in which the elongated flexible substrate includes a fold region between a first electronically conductive trace and a second electrically conductive trace such that the electromagnetic shielding layer provides electromagnetic shielding between the first electronically conductive trace and the second electrically conductive trace.

29 Claims, 6 Drawing Sheets

(51) Int. Cl.
   *H01B 11/20*   (2006.01)
   *H01B 7/08*    (2006.01)
   *H01B 12/16*   (2006.01)

(52) U.S. Cl.
   CPC ........ *H01B 11/203* (2013.01); *H01L 39/2403* (2013.01); *H01B 12/16* (2013.01)

(58) Field of Classification Search
   CPC ........... H01L 2224/48091; H01L 39/02; H01L 23/552; H01L 23/49827; H01L 23/5383; H01L 2225/06537; H05K 1/028; H05K 2201/0154; H05K 1/0218; Y10T 29/49194; G06N 10/00
   See application file for complete search history.

(56) References Cited

U.S. PATENT DOCUMENTS

| | | | |
|---|---|---|---|
| 8,946,556 B2* | 2/2015 | Sunaga | H01B 11/203 |
| | | | 174/102 R |
| 9,648,749 B1 | 5/2017 | Brokner et al. | |
| 2009/0102580 A1 | 4/2009 | Uchaykin | |
| 2010/0197505 A1 | 8/2010 | Steinmeyer et al. | |
| 2012/0267143 A1 | 10/2012 | Sunaga et al. | |
| 2015/0213924 A1 | 7/2015 | Chang | |
| 2022/0085527 A1* | 3/2022 | Martinis | H05K 1/147 |

FOREIGN PATENT DOCUMENTS

| | | |
|---|---|---|
| JP | H05299708 | 11/1993 |
| JP | H05304224 | 11/1993 |
| JP | H06-053621 | 2/1994 |
| JP | 1994164151 | 6/1994 |
| JP | 1995122788 | 5/1995 |
| JP | 2010-054937 | 3/2010 |

OTHER PUBLICATIONS

Kirchhoff's rule for quantum wires. V Kostrykin and R Schrader (Year: 1999).*

Niobium flex cable for low temperature high density interconnects. H.J. van Weers et al. (Year: 2012).*

Structure of Quantum Wires in Au/Si (557). I. K. Robinson et al. (Year: 2002).*

JP Office Action in Japanese Appln. No. 2019-554668, dated Oct. 5, 2020, 9 pages (with English translation).

PCT International Preliminary Report on Patentability in International Appln. No. PCT/US2017/050504, dated Mar. 19, 2020, 9 pages.

KR Office Action in Korean Appln. No. 10-2019-7029064, dated Aug. 7, 2020, 10 pages.

JP Decision to Grant a Patent in Japanese Appln. No. 2019-554668, dated Feb. 8, 2021, 5 pages (with English translation).

KR Allowance of Patent in Korean Appln. No. 10-2019-7029064, dated Feb. 18, 2021, 3 pages (with English translation).

Allowance of Patent in Korean Appln. No. 10-2021-7013881, dated Jan. 24, 2022, 3 pages (with English translation).

fralock.com [online], "Cirlex High Performance," available on or before Jan. 7, 2017, via Internet Archive: Wayback Machine URL <https://web.archive.org/web/20170107032507/http://www.fralock.com/aerospace/composite-materials/high-performance-materials/aerospace-cirlex-high-performance/>, retrieved on Jul. 21, 2017, URL<http://www.fralock.com/aerospace/composite-materials/high-performance-materials/aerospace-cirlex-high-performance/>, 3 pages.

PCT International Search Report and Written Opinion in International Appln. No. PCT/US2017/050504, dated May 8, 2018, 14 pages.

techbriefs.com [online], "Flexible Microstrip Circuits for Superconducting Electronics," Dec. 2013, retrieved on Jul. 21, 2017, retrieved from URL <https://www.techbriefs.com/component/content/article/tb/techbriefs/electronics-and-computers/18739>, 2 pages.

Tuckerman et al., "Flexible superconducting Nb transmission lines on thin film polyimide for quantum computing applications," https://arxiv.org/abs/1606.04557, Jun. 2016, 22 pages.

AU Office Action in Australian Appln. No. 2017430443, dated Apr. 21, 2020, 2 pages.

Notice of Allowance in Japanese Appln. No. 2021-037304, dated May 23, 2022, 5 pages.

Office Action in Chinese Appln. No. 201780089085.7, dated Dec. 5, 2022, 30 pages (with machine translation).

* cited by examiner

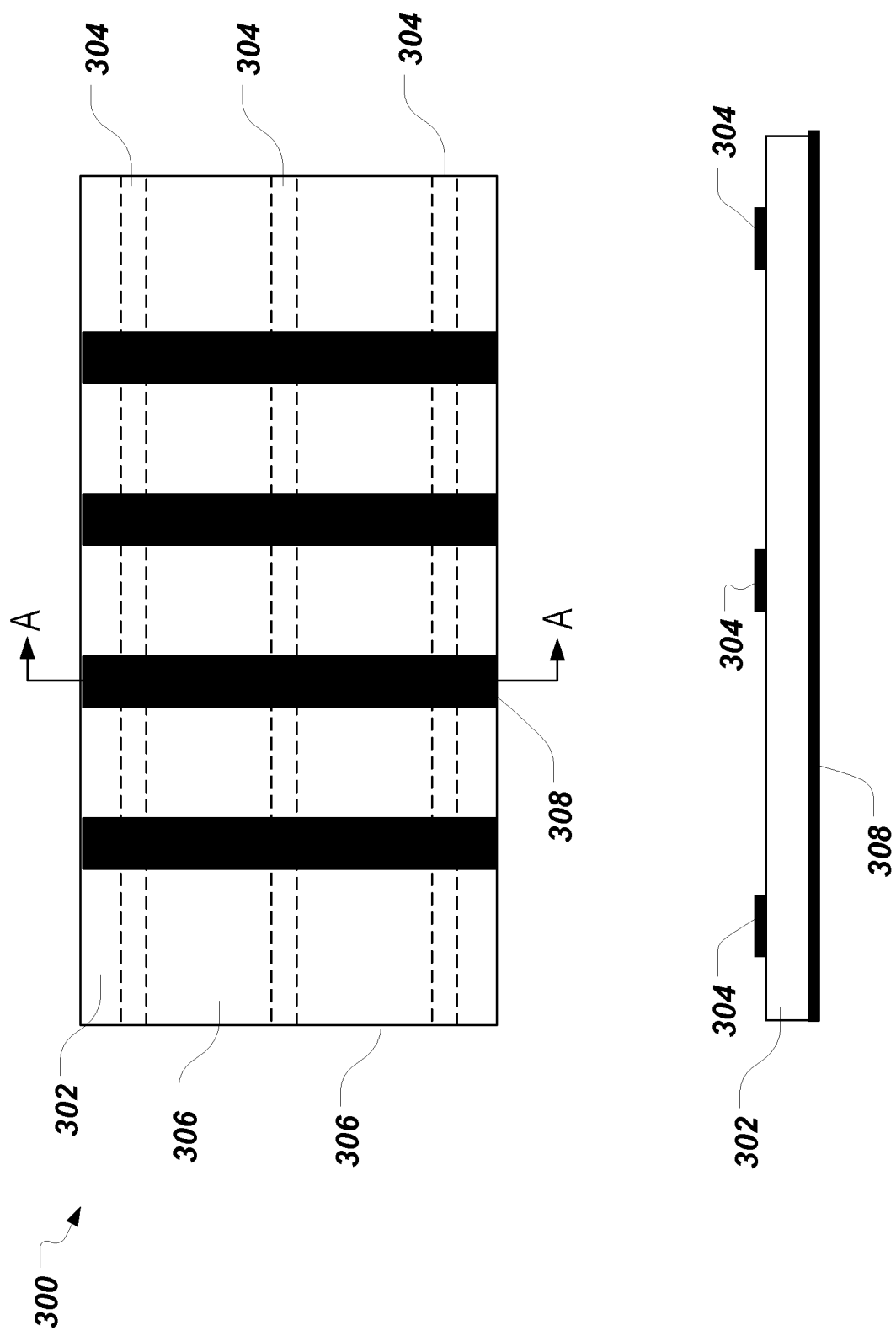

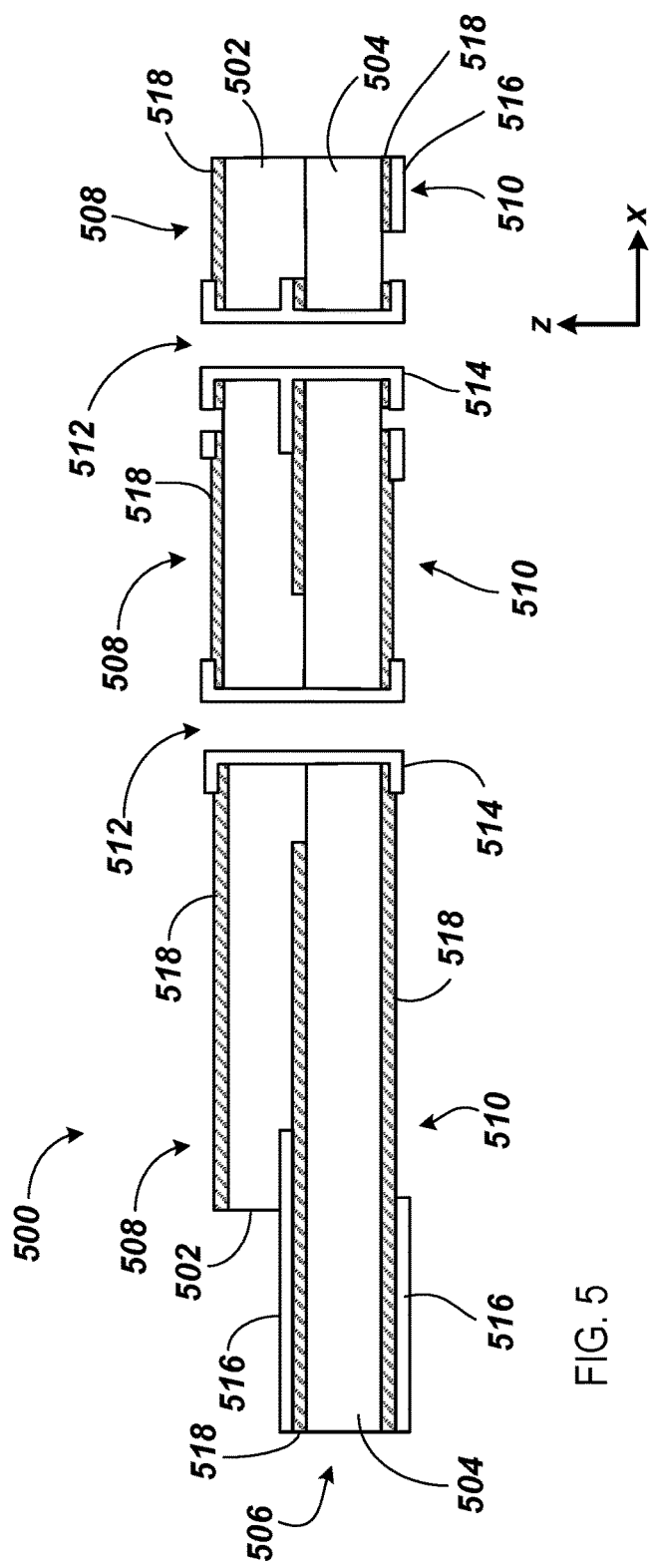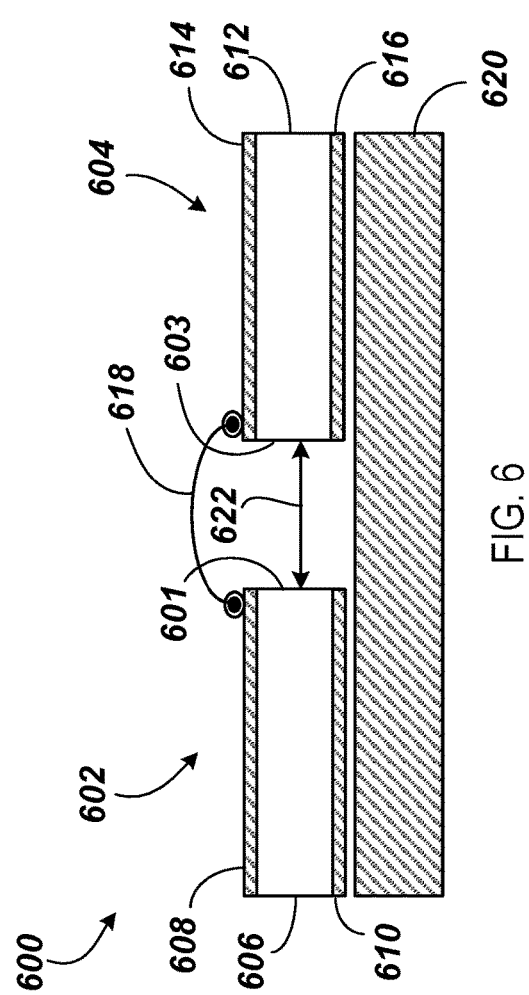

FLEXIBLE WIRING FOR LOW TEMPERATURE APPLICATIONS

CROSS-REFERENCE TO RELATED APPLICATION

This application is a National Stage Application under 35 U.S.C. § 371 and claims the benefit of International Application No. PCT/US2017/050504, filed Sep. 7, 2017. The disclosure of the foregoing application is hereby incorporated by reference in its entirety.

TECHNICAL FIELD

The present disclosure relates to flexible wiring for low-temperature applications, such as quantum processors using superconducting qubits.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as $\alpha|0\rangle+\beta|1\rangle$. The "0" and "1" states of a digital computer are analogous to the $|0\rangle$ and $|1\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

SUMMARY

In general, in some aspects, the subject matter of the present disclosure may be embodied in devices, such as flexible wiring, that include: an elongated flexible substrate; multiple electrically conductive traces arranged in an array on a first side of the elongated flexible substrate; and an electromagnetic shielding layer on a second side of the elongated flexible substrate, the second side being opposite the first side, in which the elongated flexible substrate includes a fold region between a first electronically conductive trace and a second electrically conductive trace such that the electromagnetic shielding layer provides electromagnetic shielding between the first electronically conductive trace and the second electrically conductive trace.

Implementations of the devices may include one or more of the following features. For example, in some implementations, the fold region includes a raised band in the flexible substrate, and a length of the elongated raised band extends parallel to a length of the first electrically conductive trace and the second electrically conductive trace.

In some implementations, the flexible wiring includes a first elongated groove in the fold region, and a length of the first elongated groove runs parallel to a length of the first electrically conductive trace and a length of the second electrically conductive trace.
The first elongated groove may extend into the first side or into the second side of the elongated flexible substrate. The flexible wiring may include a second elongated groove in the fold region, where a length of the second elongated groove runs parallel to the length of the first electrically conductive trace and the length of the second electrically conductive trace, and where the first elongated groove is on the first side of the substrate and the second elongated groove is on the second side of the substrate. The first elongated groove may extend into the electromagnetic shielding layer. The first elongated groove may extend into the elongated flexible substrate.

In some implementations, at least one electrically conductive trace of the multiple electrically conductive traces includes a bi-layer, the bi-layer having a superconductor layer and a metal layer on the superconductor layer. The superconductor layer may include niobium or NbTi. The metal layer may include copper or a copper alloy.

In some implementations, the electromagnetic shielding layer includes a bi-layer, the bi-layer including a superconductor layer and a metal layer on the superconductor layer. The superconductor layer may include niobium or NbTi. The metal layer may include copper or a copper alloy.

In some implementations, the electromagnetic shielding layer includes multiple microstrips having lengths oriented orthogonally with respect to the lengths of the plurality of electrically conductive traces.

In general, in some other aspects, the subject matter of the present disclosure may be embodied in devices, such as flexible wiring including: a first elongated flexible layer; a second elongated flexible layer bonded to the first elongated flexible layer; multiple electrically conductive traces arranged at a bond interface between the first elongated flexible layer and the second elongated flexible layer; a first electromagnetic shielding layer on a principal surface of the first elongated flexible layer; a second electromagnetic shielding layer on a principal surface of the second elongated flexible layer; and a via extending through the first elongated flexible layer, wherein the via includes a superconductor via contact.

Implementations of the flexible wiring may include one or more of the following features. For example, in some implementations, the via includes an adhesive layer, the superconductor via contact being formed on the adhesive layer.

In some implementations, the via extends from the first electromagnetic shielding layer to at least one electrically conductive trace of the plurality of electrically conductive traces, and the superconductor via contact is connected to the first electromagnetic shielding layer and the at least one electrically conductive trace.

In some implementations, the via extends from the first electromagnetic shielding layer to the second electromagnetic shielding layer, and the superconductor via contact is connected to the first electromagnetic shielding layer and the at least one electrically conductive trace.

In general, in other aspects, the subject matter of the present disclosure may be embodied in devices including: a first flexible wiring comprising a first elongated flexible substrate, a first multiple of electrically conductive traces arranged in an array on a first side of the first elongated flexible substrate, and a first electromagnetic shielding layer on a second side of the first elongated flexible substrate, the second side of the first elongated flexible substrate being opposite the first side of the first elongated flexible substrate; a second flexible wiring including a second elongated flexible substrate, a second multiple of electrically conductive traces arranged in an array on a first side of the second elongated flexible substrate, and a second electromagnetic shielding layer on a second side of the second elongated flexible substrate, the second side of the second elongated flexible substrate being opposite the first side of the second elongated flexible substrate, in which the first flexible wiring is coupled to the second flexible wiring through a butt joint.

Implementations of the devices may include one or more of the following features. For example, in some implementations, the butt joint includes a wire bond that connects a first electrically conductive trace from the first multiple of electrically conductive traces to a first electrically conductive trace from the second multiple of electrically conductive traces.

In some implementations, the butt joint includes a solder bridge that connects a first electrically conductive trace from the first multiple of electrically conductive traces to a first electrically conductive trace from the second multiple of electrically conductive traces.

In some implementations, the devices include a metal block secured to and in thermal contact with the first electromagnetic shielding layer and to the second electromagnetic shielding layer.

In general, in other aspects, the subject matter of the present disclosure may be embodied in devices including: a first flexible wiring including a first elongated flexible substrate, a first multiple of electrically conductive traces arranged at a bond interface within the first elongated flexible substrate, a first electromagnetic shielding layer on a first principal surface of the first elongated flexible substrate, and a second electromagnetic shielding layer on a second principal surface of the first elongated flexible substrate; a second flexible wiring including a second elongated flexible substrate, a second multiple of electrically conductive traces arranged at a bond interface within the second elongated flexible substrate, a third electromagnetic shielding layer on a first principal surface of the second elongated flexible substrate, and a fourth electromagnetic shielding layer on a second principal surface of the second elongated flexible substrate, in which the first flexible wiring is electrically coupled to the second flexible wiring through a butt joint.

Implementations of the devices may include one or more of the following features. For example, in some implementations, the first elongated flexible substrate includes a first cavity through which a first electrically conductive trace of the first multiple of electrically conductive traces is exposed, and the second elongated flexible substrate comprises a second cavity through a first electrically conductive trace of the second multiple of electrically conductive traces is exposed. The butt joint may include a wire bond that connects the exposed first electrically conductive trace of the first multiple of electrically conductive traces to the exposed first electrically conductive trace of the second multiple of electrically conductive traces.

In some implementations, the butt joint includes a solder bridge that connects the exposed first electrically conductive trace of the first multiple of electrically conductive traces to the exposed first electrically conductive trace of the second multiple of electrically conductive traces.

In some implementations, the devices further include a first metal block secured to and in thermal contact with the first electromagnetic shielding layer and to the third electromagnetic shielding layer. The devices may further include a second metal block secured to and in thermal contact with the second electromagnetic shielding layer and to the fourth electromagnetic shielding layer.

In general, in other aspects, the subject matter of the present disclosure may be embodied in systems including: a cryostat including a first stage configured to be held within a first temperature range; a quantum information processing system within the first stage; and flexible wiring within the first stage and coupled to the quantum information processing system, in which the flexible wiring includes an elongated flexible substrate, a multiple of electrically conductive traces arranged in an array on a first side of the elongated flexible substrate, and an electromagnetic shielding layer on a second side of the elongated flexible substrate, the second side being opposite the first side, in which the elongated flexible substrate includes a fold region between a first electronically conductive trace and a second electrically conductive trace such that the electromagnetic shielding layer provides electromagnetic shielding between the first electronically conductive trace and the second electrically conductive trace.

In general, in other aspects, the subject matter of the present disclosure may be embodied in systems including: a cryostat including a first stage configured to be held within a first temperature range; a quantum information processing system within the first stage; and flexible wiring within the first stage and coupled to the quantum information processing system, in which the flexible wiring includes a first elongated flexible layer; a second elongated flexible layer bonded to the first elongated flexible layer; multiple electrically conductive traces arranged at a bond interface between the first elongated flexible layer and the second elongated flexible layer; a first electromagnetic shielding layer on a principal surface of the first elongated flexible layer; a second electromagnetic shielding layer on a principal surface of the second elongated flexible layer; and a via extending through the first elongated flexible layer, in which the via includes a superconductor via contact.

Particular implementations of the subject matter described here can realize one or more of the following advantages. For example, in some implementations, folded regions of the flexible wiring provide electromagnetic shielding between signal traces. The shielding can reduce crosstalk without requiring the formation of via holes within the substrate. In some implementations, when vias are provided within the substrate, the via may be filled with a superconducting material (e.g., niobium) that allows for improved signal integrity and a reduction in crosstalk. Additionally, because material that is superconducting does not exhibit a DC resistance, the via metal will not lead to resistive heating. In some implementations, the flexible wiring allows a substantial increase in the number and density of wires that can be connected to a device (e.g., a quantum information processing system) contained within a cryostat relative to apparatuses that use co-axial cables. Additionally, by using flexible wiring in place of co-axial cables, the space otherwise required by co-axial cables may be freed up for purposes other than providing electrical connections. In some implementations, the flexible wiring utilizes material, such as copper, a copper alloy (e.g., brass), or a superconductor (e.g., NbTi), that offers a relatively low thermal conductivity and therefore low heat load. Furthermore, in some implementations, the fabrication costs associated with flexible wiring may be lower on a per wire basis than apparatuses that rely on co-axial cables. In some implementations, the flexible wiring may be bonded to other flexible wiring using a butt joint in place of co-axial cable connectors. By using a butt joint in place of co-axial cable connectors, a large number of connections may be established. Additionally, using a butt joint may free up space within the cryostat that would otherwise be used by the co-axial cable connectors. Moreover, in some implementations, butt joints provide a lower cost fabrication technique relative to soldering circuit boards together, especially when large numbers of connections need to be made.

The details of one or more implementations are set forth in the accompanying drawings and the description below. Other features and advantages will be apparent from the description, the drawings, and the claims.

BRIEF DESCRIPTION OF THE DRAWINGS

FIG. 4 is a schematic that illustrates an example of flexible wiring.

FIG. 5 is a schematic that illustrates an example of flexible wiring.

FIG. 6 is a schematic that illustrates an example of a modified butt joint bond for flexible wiring.

DETAILED DESCRIPTION

Quantum computing entails coherently processing quantum information stored in the quantum bits (qubits) of a quantum computer. Superconducting quantum computing is a promising implementation of solid-state quantum computing technology in which quantum information processing systems are formed, in part, from superconducting materials. To operate quantum information processing systems that employ solid-state quantum computing technology, such as superconducting qubits, the systems are maintained at extremely low temperatures, e.g., in the 10s of mK. The extreme cooling of the systems keeps superconducting materials below their critical temperature and helps avoid unwanted state transitions. To maintain such low temperatures, the quantum information processing systems may be operated within a cryostat, such as a dilution refrigerator. In some implementations, the limited cooling capacities of such cryostats requires that control signals be generated in higher-temperature environments, where much greater cooling capacity is available and dissipative circuits are less likely to disrupt qubits within the quantum information processing system. Control signals may be transmitted to the quantum information processing system using shielded impedance-controlled GHz capable transmission lines, such as coaxial cables.

It is expected that the number of qubits utilized in quantum information processing systems will increase significantly (e.g., tens of thousands, hundreds of thousands, millions or more) in the near future. With increasing numbers of qubits, the number of transmission lines (e.g., control and data lines) required for driving the qubits and for reading output from operations performed by the quantum information processing systems also are likely to substantially increase.

The present disclosure is directed to wiring for low-temperature applications, such superconducting quantum information processing systems, in which the wiring allows, in certain implementations, substantial increases in transmission line density, while maintaining low cross-talk among transmission lines, as well as low heat loads. Additionally, the devices and methods disclosed herein may provide, in certain implementations, low cost alternatives to bulky transmission lines such as coaxial cables.

Figure 1:
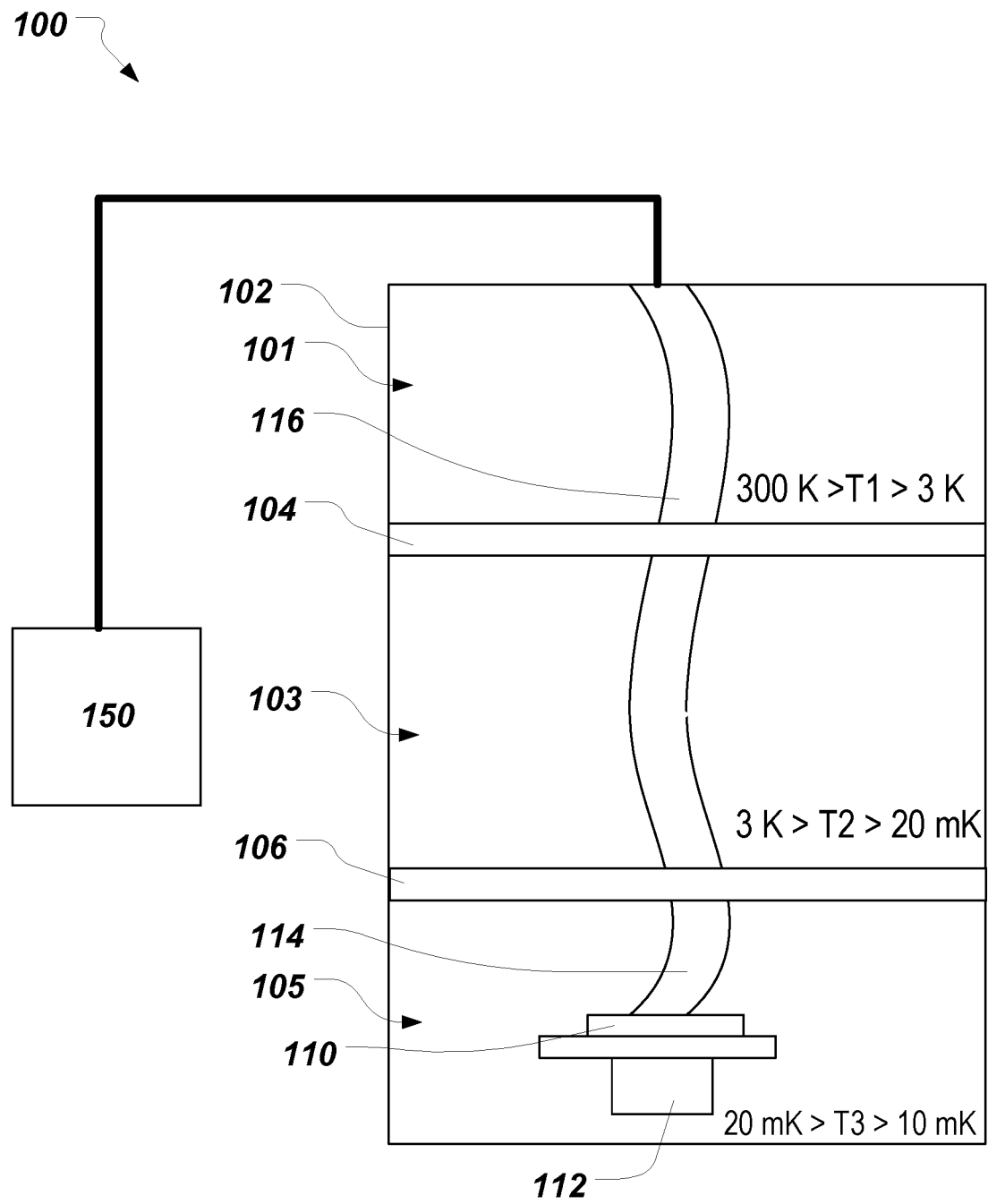
FIG. 1 is a schematic that illustrates an example of a refrigeration system for cooling quantum information processing systems.

FIG. 1 is a schematic that illustrates an example of a refrigeration system 100 for cooling quantum information processing systems. The exemplary refrigeration system 100 includes a cryostat 102 in which a quantum information processing system 110 may be contained. The cryostat 102 cools the ambient environment surrounding the quantum information processing system 110 to a temperature that is suitable for performing operations with the system 110. For example, in implementations in which the quantum information processing system 110 includes a quantum processor having superconducting qubits, the cryostat 102 may cool the ambient environment surrounding the quantum processor to temperatures below the critical temperature of the superconducting material, e.g., down to about 20 mK, or about 10 mK. Examples of superconducting materials that may be used in superconducting quantum information processing systems include Al (Tc=1.2 K), In (Tc=3.4 K) and Nb (Tc=9.3 K). The cryostat 102 may be cooled using liquid or gas cryogens, such as helium and nitrogen, or cooled with a closed cycle cryocooler using helium gas. In some cases, the circuit elements of the quantum information processing system 110 operate at microwave frequencies (e.g., frequencies in the range of about 300 MHz to about 100 GHz, such as between about 300 MHz and 10 GHz). Accordingly, the cryostat 102 may include external and internal electromagnetic shielding to block interference with the quantum information processing system 110.

In some implementations, a cryostat includes multiple thermally isolated stages that span a large temperature difference (e.g., different stages of a dilution refrigerator). For instance, the exemplary cryostat 100 includes multiple stages 101, 103, and 105. The first stage 101 may be maintained at a first temperature range T1, whereas the second stage 110306 may be maintained at a second temperature range T2 that is lower than the first temperature T1, and the third stage 105 may be maintained at a third temperature range T3 that is lower than the second temperature T2. For example, the third temperature range T3 may be at or lower than the critical temperature Tc for the superconducting materials that are used in the quantum information processing system 110, e.g., T2≈10-20 mK. In contrast, the second stage 103 may be maintained at a higher temperature than the third stage 105. For example, the second stage 103 may be maintained within a temperature range T2 that is less than 3 K and greater than 20 mK. The first stage 101 may be maintained within a temperature range that is higher than the second stage 103. For example, the first second stage 101 may be maintained within a temperature range T1 that is less than 300 K and greater than 3 K. Though only three stages are shown in the example of FIG. 1, the cryostat can include additional stages at different temperature levels. For instance, in some cases, the cryostat may include fourth and fifth stages held within a fourth temperature range T4 and a fifth temperature range T5, respectively. Each temperature stage of the cryostat typically spans, e.g., a few cm in length to the next temperature stage.

Each stage within the cryostat 100 may be separated by a boundary 104, 106. The boundaries 104, 106 may include thermal sinks held at a constant temperature. The stages of the cryostat 102 are operated under a vacuum environment. For example, the first stage 101, the second stage 103, and the third stage 105 may be operated under a vacuum base pressure of about 1×10⁻⁷ Torr or less. The quantum information processing system 110 may include a substrate (e.g., a dielectric substrate such as silicon or sapphire) on which are formed quantum information processing devices, such as qubits. The qubits may be couplable to one another so that, during operation of the system 110, the qubits perform useful computations. In addition to qubits, the quantum information processing system 110 may include other components, such as measurement readout devices, coupler devices for coupling the qubits, and control devices for driving and tuning the qubits. The quantum information processing system 110 may be positioned and/or fixed to a sample mount 112 within the third stage 105.

To control and to read data from the quantum information processing system 110, the quantum information processing system 110 may be coupled to control electronics 150 arranged outside of the cryostat 102. In the example shown in FIG. 1, the control electronics 150 are coupled to the quantum information processing system 110 within the cryostat 102 using flexible wiring 114, 116. Signals generated by the control electronics 150 or by the quantum information processing system 110 are transmitted over the flexible wiring 114, 116. The flexible wiring 114, 116 includes, for example, multiple electrically conductive wires on or within an elongated flexible substrate. The flexible wiring 114, 116 may include electromagnetic shielding to protect the wires from signal interference. Additionally, the wires within the wiring 114, 116 may be impedance matched to the quantum information processing system 110 and the control electronics 150 to reduce signal reflections from loads.

Each flexible wiring 114, 116 may include multiple individual wires. The individual wires may extend along the length (the long dimension) of the flexible wiring 114, 116, and may be arranged in an array (e.g., the wires may extend in parallel along the length of the flexible wiring 114, 116). The total number of wires within or on a flexible wiring may vary. For example, each flexible wiring 114, 116 may include 10 or more wires, 20 or more wires, 30 or more wires, 50 or more wires, 100 or more wires, or 200 or more wires. Other numbers of wires may be used within each flexible wiring 114, 116 as well. Each flexible wiring may be coupled to another flexible wiring so that data and control signals may be transmitted from one flexible wiring to another. For example, flexible wiring 114 may be coupled to flexible wiring 116. In some implementations, a first set of at least two flexible wiring are coupled to a second set of at least two flexible wiring, respectively. For example, a first set of 5, 10, 15, 20 or more flexible wiring may be coupled to a second set of 5, 10, 15, 20 or more flexible wiring, respectively. Other numbers of flexible wiring may be coupled together. For the first and/or second set, the flexible wiring within the set may be stacked directly on one another or, alternatively, individual flexible wiring within the stack may be separated from one another using a spacer (e.g., a 2-10 mm spacer). An advantage of forming multiple wires within flexible wiring, and/or using multiple flexible wiring, is that, in some implementations, the smaller footprint and greater wire density of the flexible wiring allows the total number of connections between the quantum information processing system and the control electronics to be greatly increased compared to apparatuses that rely on coaxial cables. In some implementations, short sections of the flexible wiring 114, 116 are clamped at the boundaries 104, 106 or elsewhere within the cryostat 100 to thermally sink the flexible wiring 114, 116. For instance, wiring 116 may be clamped to a heat sink held at a temperature of 3 K at boundary 104. Similarly, wiring 114 may be clamped to a heat sink held at a temperature of 20 mK at boundary 106. In contrast, the distance between boundaries where the wiring 114, 116 is much longer than the clamping length to decrease the flow of thermal energy.

Figure 2:
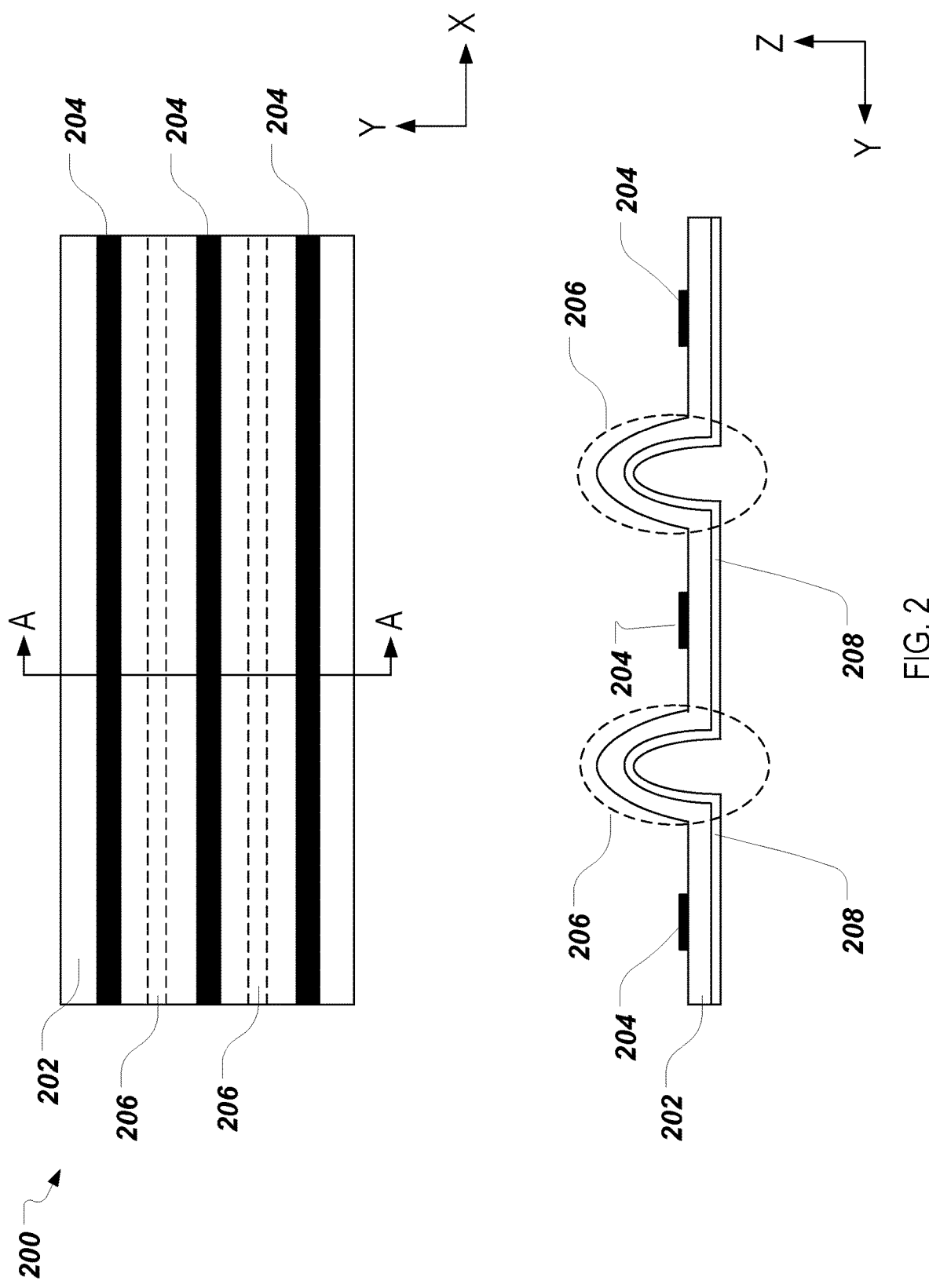
FIG. 2 is a schematic that illustrates an example of flexible wiring.

FIG. 2 is a schematic that illustrates an example of flexible wiring that may be used for low temperature applications, including, e.g., for coupling to quantum information processing systems within cryostats, such as cryostat 102. A plan-view of a top surface of a flexible wiring 200 and a cross-section view of the flexible wiring 200 along line A-A are shown in FIG. 2. As shown in the plan-view, flexible wiring 200 includes an elongated flexible substrate 202. The flexible wiring 200 also includes multiple electrically conductive traces 204 arranged on a principal surface (e.g., the top surface or side) of the elongated flexible substrate 202. Each conductive trace 204 corresponds to an individual wire and the multiple traces 204 may be arranged in an array. For example, the conductive traces 204 may arranged in parallel, with their long dimension (e.g., their length) extending along the long dimension (length) of the elongated flexible substrate 202. The spacing between adjacent traces 204 may be the same for each pair of adjacent traces 204.

The elongated flexible substrate 202 may be formed from a flexible plastic ribbon, such as a polyimide ribbon. Examples of materials that can be used for the elongated flexible substrate 202 include, e.g., poly (4,4'-oxydiphenylene-pyromellitimide) (also referred to as Kapton®). The thickness of the elongated flexible substrate 202 may be, e.g., between about 10 μm to about 500 μm, including thicknesses such as 20 μm, 50 μm, 75 μm, and 100 μm, among others. The width of the elongated flexible substrate 202 may be, e.g., between about 1 mm to about 30 mm, including widths such as 10 mm, 15 mm, and 20 mm, among others. The length of the elongated flexible substrate 202 may be at least as long as is necessary to provide coupling between devices, systems and/or other wiring.

The conductive traces 204 include thin film materials that may be patterned on the elongated flexible substrate 202. The conductive traces 204 may include, e.g., a single layer of material or a bi-layer of material. The material that may be used to form the conductive traces 204 may include superconducting material and/or metals that are not superconducting. Examples of materials that may be used to form the conductive traces 204 includes, e.g., copper, copper alloys (cupronickels, brass, bronze), aluminum, indium, NbTi, NbTi alloys, and/or niobium. Because in some cases, copper may have a thermal conductivity that is too high, and would otherwise lead to higher thermal transport, it may be advantageous to use copper alloys having a lower thermal conductivity. This helps to decrease the lower thermal power load, such that low temperatures required for operation of the quantum information processing system 110 may be maintained by the cryostat. In the case of a bi-layer trace, the trace 204 may include a first layer formed on and in contact with the elongated flexible substrate 202 and a second layer formed on and in contact with the first layer. The first layer of the bi-layer trace may include, e.g. a superconducting material such as niobium, whereas the second layer of the bi-layer trace may include, e.g., a non-superconducting material such as copper or a copper alloy. To improve adhesion of the metal or superconductor to the surface of the substrate 202, e.g., in the case of a polyimide substrate, the substrate 202 may be ion milled. Alternatively, the first layer of the bi-layer trace may include a non-superconducting material such as copper and the second layer of the bi-layer trace may include a superconducting material such as niobium or aluminum. In some implementations, the material used to form the conductive traces may depend on where the flexible wiring is used in the cryostat. For example, in the lowest temperature regions (e.g., where the quantum information processing systems may be located) such as between 3 K to 10 mK, the flexible wiring may be formed using materials having low loss tangent and low thermal transport. In such cases, the conductive traces may be formed from superconductors, such as niobium. In higher temperature regions of the cryostat (e.g., where the wiring transitions from low temperature to room temperature) such as for temperatures above 3 K, the flexible wiring may be formed from materials with are not superconducting but have lower thermal transport, such as copper alloys, though high-temperature superconductors (e.g., Nb) also may be used. Additionally, in some implementations, the material forming the traces may be selected for its role in providing solder connections. For example, copper may be used in regions where wire bonds or other solder bonds are required.

The length of the conductive traces 204 may be as long as the length of the elongated flexible substrate 202. The width of each conductive trace 204 may be, e.g., between about 1 μm to about 250 μm, including widths such as 5 μm, 10 μm, 20 μm, 30 μm, 50 μm, or 100 μm, among others. In some implementations, the widths of the conductive traces are selected to provide a predetermined impedance, e.g., a 50 ohm impedance, or a 75 ohm impedance, in order to reduce signal reflections from a load. The thickness of each conductive trace 204 may be, e.g., between about 10 nm to about 100 μm, including thicknesses such as 50 nm, 100 nm, 250 nm, 500 nm, 750 nm, 1 μm, 5 μm, 10 μm, 20 μm, 50 μm, among others. In the case of bi-layer conductive traces, each layer may have the same or different thicknesses. For example, in some implementations, the first layer has a thickness of 2 μm, whereas the second layer has a thickness of 5 μm. Alternatively, in some cases, the first layer has a thickness of 20 μm, whereas the second layer has a thickness of 5 μm. The conductive traces 204 may be separated by a constant or variable pitch. For example, in some implementations, the pitch between adjacent conductive traces 204 is between about 1 μm to about 1 mm, including pitches such as 5 μm, 10 μm, 50 μm, 100 μm, 250 μm, 500 μm, or 750 μm, among others. The conductive traces 204 may be formed on the elongated flexible substrate 202 using integrated chip (IC) fabrication techniques such as deposition (e.g., sputtering and vapor deposition), etching, and/or lift-off techniques.

As shown in the cross-section view A-A of FIG. 2, the flexible wiring 200 includes an electrically conductive layer 208 on a second principal surface/bottom side of the elongated flexible substrate 202, in which the second principal surface is opposite to that of the first principal surface/top side. The electrically conductive layer 208 can be an electromagnetic shielding layer for shielding the conductive traces 204 from crosstalk. To allow the electromagnetic shielding layer 208 to provide shielding between traces 204, the flexible substrate 202 includes fold regions 206. Fold regions 206 includes regions of the flexible substrate 202 in which the substrate 202 has been folded such that an elongated raised band is provided. The elongated raised band of the fold region 206 may have a length that extends between and alongside the conductive traces 204. For example, the elongated raised band of the fold region 206 may extend parallel to the conductive traces 204 within the space between adjacent conductive traces 204. The raised band may be formed by folding the flexible substrate back on itself in a manner similar to a pleat. In some implementations, the peak or apex of the raised band extends above the top surfaces of the electrically conductive traces 204 (e.g., the surfaces of the traces 204 facing away from the substrate 202). With the substrate 202 folded in this manner, the electromagnetic shielding layer 208 in the fold region 206 creates an elongated arc that serves as a wall extending between adjacent traces 204. The span of the arc of each fold region 206 is depicted by two parallel dashed lines in the plan view of FIG. 2. Furthermore, the peak or apex of the elongated arc within the fold region 206 may extend above the top surface surfaces of the electrically conductive traces 204. As a result, the shielding layer 208 within the fold region 206 provides an electromagnetic barrier between adjacent traces to shield against crosstalk between the traces. As shown in the cross-section view of FIG. 2, the fold regions 206 appear as raised fins and give the flexible wiring an accordion-like shape. The fold regions 206 shown in FIG. 2 include portions of the first principal surface of the flexible substrate that do not have the conductive traces 204 formed on them. In other implementations, the fold regions 206 may include portions of the first principal surface of the substrate 202 on which the conductive traces 204 are formed. An advantage of introducing the fold regions 206 is that shielding between traces can be provided without the need to provide external shielding to the wires or to form shielding within the substrate 202 as might be needed for a stripline design. In some implementations, the fold regions 206 may provide an order of 20-60 dB or higher reduction in crosstalk between adjacent conductive traces relative to a flexible wiring having the conductive traces formed on a first principal side without the fold regions.

Figure 3:
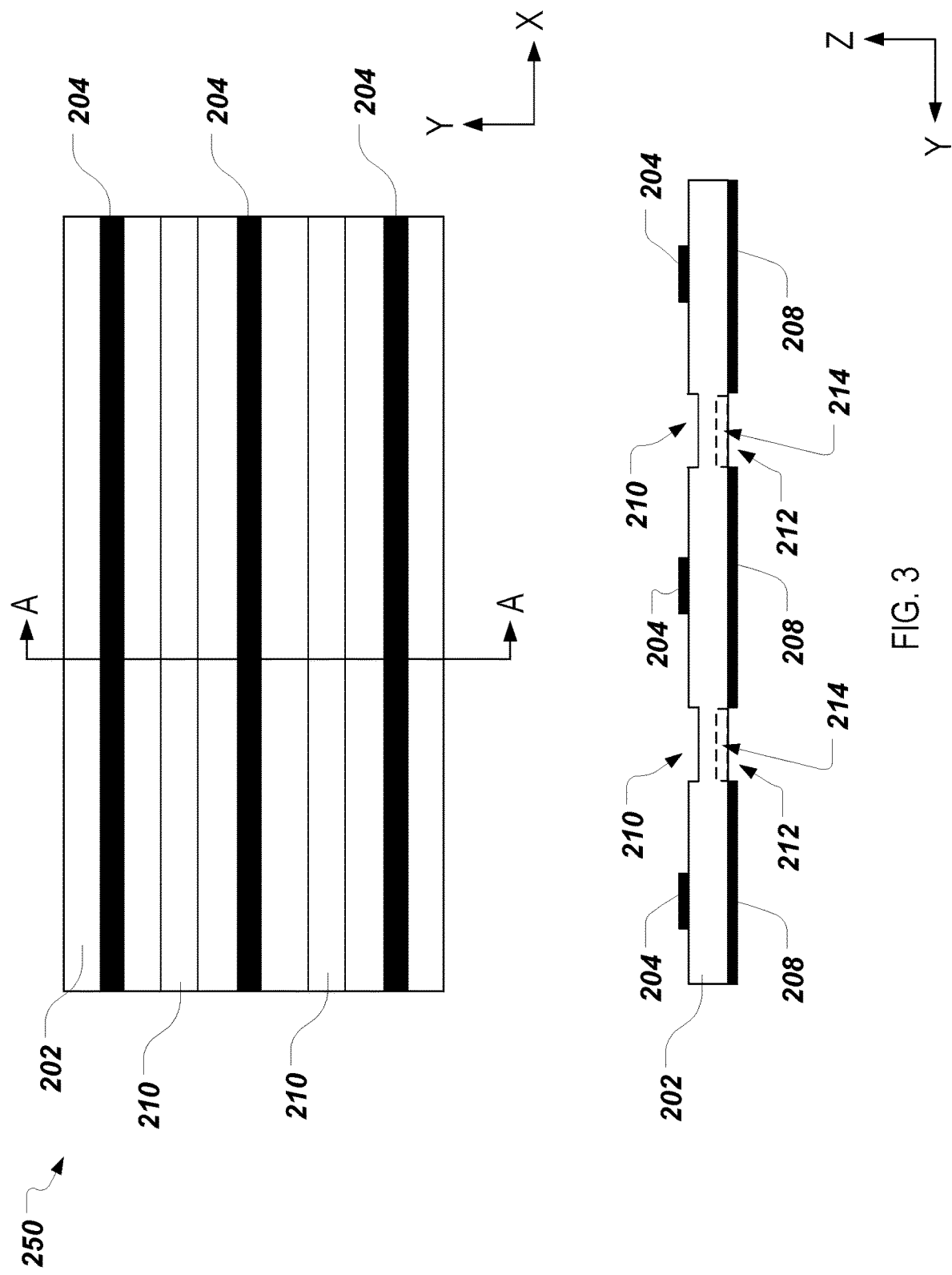
FIG. 3 is a schematic that illustrates an example of flexible wiring.

To hold the fold regions in place so that the substrate does not return to its initial flattened state, the substrate and/or electromagnetic shield layer 208 can be modified to introduce mechanical stress that helps to hold the fold shape. FIG. 3 is a schematic that illustrates an example of flexible wiring 250 that includes groove regions to introduce mechanical stress for holding fold regions in place. Like wiring 200, flexible wiring 250 includes an elongated flexible substrate 202, electrically conductive traces 204 on a first principal side of the substrate 202, and an electromagnetic shielding layer 208 on a second principal side of the substrate 202. The various parameters relating to materials and dimensions discussed herein with respect to wiring 200 also may apply to wiring 250. A difference between wiring 250 (shown in the plan view and cross-section view along line A-A in FIG. 3) and the wiring 200 in FIG. 2 is that the wiring 250 is shown in a flattened state to aid illustration of the grooves formed in the fold regions. Upon folding the substrate 202 to provide fold regions, the grooves may provide mechanical stress that holds the fold regions in place.

In some implementations, the grooves, e.g., grooves 210, are formed within the first principal surface of the substrate 202. A length of the groove 210 extends parallel (e.g., long the X-direction in FIG. 3) to a length of the one or more adjacent conductive traces 204. The groove 210 may have various different depths into the substrate 202. For example, the groove depth may range between about 1 μm to about 500 μm, such as 10 μm, 20 μm, 50 μm, 70 μm, 100 μm, 200 μm, 250 μm, 300 μm, or 400 μm, among other depths. The groove 210 may have various different widths. For example, the groove width may range between about 10 μm to about 1 mm, such as 20 μm, 50 μm, 100 μm, 250 μm, 500 μm, or 750 μm, among other widths. The groove 210 may extend the entire length of the elongated flexible substrate 202 or may extend to a length that is shorter than the entire length of the elongated flexible substrate. In the example of FIG. 3, each groove 210 is shown as a single continuous extending between adjacent conductive traces 204. In other implementations, multiple separate individual grooves may be formed between the conductive traces 204, whether arranged in a single line or in a series of lines (e.g., a 2-dimensional array).

In some implementations, the grooves, e.g., grooves 212, are formed within the second principal surface of the substrate 202. The same variation in groove depth, width length, and arrangement as explained herein with respect to grooves 210 may apply to grooves 212. The electromagnetic shielding layer 28 may coat the grooves formed within the second principal surface of the flexible substrate 202. As shown in the cross-section view along line A-A of FIG. 3, the grooves 212 may be positioned between adjacent conductive traces 204, e.g., along the Y-axis. In some implementations, as shown in FIG. 3, the grooves 212 are formed within the electromagnetic shielding layer 208 instead of the second principal surface of the substrate 202. That is, the electromagnetic shielding layer 208 may be patterned (e.g., through photolithography and etching or lift-off processes) in such a way that the openings are formed within the electromagnetic shielding layer alone and not within the substrate 202. The groove depth may extend entirely through the electromagnetic shielding layer 208 or partially through the electromagnetic shielding layer 208. In some implementations, the groove extends through the electromagnetic shielding layer 208 and into the second principal surface of the flexible substrate 202 as depicted by groove 214 bound by dashed lines in the cross-section view of FIG. 3.

The grooves may be formed in the flexible substrate 202 using photo-processing techniques (e.g., spin-coating resist on the substrate 202, exposing and developing a pattern in the resist, and etching exposed regions of the substrate 202 to form grooves). In other implementations, the grooves may be formed user laser processing (e.g., polyimide laser drill technology).

In some implementations, the fold regions of flexible wiring may be held in place by arranging the electromagnetic shielding layer in multiple strips that extend across the second principal surface of the elongated flexible substrate. The strips may be used instead of or in addition to grooves as described herein. For example, FIG. 4 is a schematic that illustrates an example of flexible wiring 300. In particular, FIG. 4 includes a plan-view of the second principal surface of a flexible wiring substrate 302 on which electromagnetic shielding 308 is formed, and a cross-section view through substrate 302 at line A-A. In the plan view of FIG. 4, the position, boundaries and arrangement of the conductive traces 304 formed on the first principal surface of the substrate 302 are depicted using dashed lines. The flexible wiring 300 is shown in its flattened state, i.e., without the fold regions yet formed.

As shown in FIG. 4, the electromagnetic shielding layer 308 is arranged in multiple separate strips that have a length extending along the Y-direction. Upon folding the substrate 302 to provide fold regions, the shielding layer strips 308 may provide mechanical stress that holds the fold regions in place. As further shown in the plan view of FIG. 4, the lengths of strips 308 extend along a direction (Y-direction) that is orthogonal to a direction (X-direction) along which the lengths of the conductive traces 304 extend. An advantage of using separate strips to form the electromagnetic shielding layer 308 is that the lower overall thermal transport can be achieved since less thermally conductive material is being used to provide the shielding layer.

Alternatively, in some implementations, the strips may be formed in addition to a grounding layer rather than as the grounding layer. For example, a ground plane layer, such as layer 208, may be provided on the second principal surface of the elongated flexible substrate to provide a ground plane, and multiple strips, such as strips 308 may be formed on the surface of the ground plane layer to provide mechanical stability. For instance, the ground plane layer may be formed from niobium, whereas the strips formed on the surface of the ground plane layer may be formed from copper. The dimensions described herein with respect to layer 208 may also be applied to the ground plane layer. Similarly, the dimensions and spacing described herein with respect to strips 308 may also be applied to the strips formed on the ground plane layer.

In some implementations, the number of wires contained within a flexible wiring can be increased by stacking the flexible wiring. For example, any of the flexible wiring 200, 250 or 300 may be stacked together to provide stacked flexible wiring. In some cases, the flexible wiring may be stacked together using an adhesive-based or adhesiveless laminate bonding technique (e.g., the application of heat and/or pressure to bond polyimide layer together). Use of adhesiveless polyimide bonding can be advantageous in certain implementations, as it eliminates the adhesive that sometimes leads to outgassing under vacuum environments. Furthermore, adhesiveless laminates may have a coefficient of thermal expansion (CTE) that is closely matched to the CTE of copper, thus reducing stress between the substrate and shielding/traces caused by substantial changes in temperature when cooling down to extremely low temperatures, such as the temperatures used in a cryostat. In some cases, the stacked flexible wiring can be formed using polymer encapsulants that are sprayed or painted on an initial elongated polymer substrate that includes the electrically conductive traces/shielding layer. For instance, in some cases, a flexible wiring such as wiring 200, 250 or 300 can be sprayed or painted with an epoxy encapsulant (e.g., Stycast 2850FT) that is then cured to provide an additional polymer layer on which further electrically conductive materials may be deposited and patterned.

In contrast to the flexible wiring illustrated in FIGS. 2-4, in some implementations, the flexible wiring may be formed as a stripline. FIG. 5 is a schematic that illustrates an example of flexible wiring 500 formed in a stripline configuration. The flexible wiring 500 includes a signal trace 506 arranged between a first elongated flexible substrate portion 502 and a second elongated flexible substrate portion 504. The signal trace 506 may include an electrically conductive thin film material for transmitting control and/or data signals. A top surface (e.g., a first principal surface) of the first elongated flexible substrate portion 502 may include a first electrically conductive layer 508, whereas a bottom surface (e.g., a second principal surface) of the second elongated flexible substrate portion 504 may include a second electrically conductive layer 510. The first electrically conductive layer 508, the second electrically conductive layer 510, and the signal trace 506 may include, e.g., a thin film materials such as a metal or superconductor thin films. For instance, the metal or superconductor thin film may include a copper, copper alloy, aluminum, niobium, or indium thin film layer. Although only a single signal trace 506 is illustrated in FIG. 5, multiple signal traces 506 may be included between the first elongated flexible substrate portion 502 and the second elongated flexible substrate portion 504 (e.g., along the Y-axis into and out of the page of FIG. 5). For example, such signal traces 506 may be aligned in parallel in a similar manner to electrically conductive traces 204 shown in FIG. 2.

In some cases, the first electrically conductive layer 508, the second electrically conductive layer 510, and/or the signal trace 506 may include a bi-layer film, such as described herein with respect to flexible wiring 200. For example, as shown in FIG. 5, the second electrically conductive layer 510 may include a bi-layer film having a first thin film layer 518 formed on and/or in contact with the bottom surface of the second elongated flexible substrate portion 504. The bi-layer film further may include a second thin film layer 516 formed on and in contact with the first thin film layer 518. The bi-layer film also may be formed on the top surface of the first elongated flexible substrate portion 502. In some implementations, portions of the second layer 516 are removed, revealing the underlying first layer 518.

The length of the signal traces 506 may be as long as the length of the elongated flexible substrate portions 502, 504. The width of each signal trace 506 may be, e.g., between about 1 µm to about 250 µm, including widths such as 5 µm, 10 µm, 20 µm, 30 µm, 50 µm, or 100 µm, among others. The thickness of each signal trace 506 may be, e.g., between about 10 nm to about 100 µm, including thicknesses such as 50 nm, 100 nm, 250 nm, 500 nm, 750 nm, 1 µm, 5 µm, 10 µm, 20 µm, 50 µm, among others. In the case of bi-layer conductive traces, each layer may have the same or different thicknesses. For example, in some implementations, the first layer has a thickness of 2 µm, whereas the second layer has a thickness of 5 µm. Alternatively, in some cases, the first layer has a thickness of 20 µm, whereas the second layer has a thickness of 5 µm. The conductive traces 204 may be separated by a constant or variable pitch. For example, in some implementations, the pitch between adjacent signal traces 506 is between about 1 µm to about 1 mm, including pitches such as 5 µm, 10 µm, 50 µm, 100 µm, 250 µm, 500 µm, or 750 µm, among others. The signal traces 506 may be formed on the elongated flexible substrate portion 502 or portion 504 using integrated chip (IC) fabrication techniques such as deposition (e.g., sputtering and vapor deposition), etching, and/or lift-off techniques.

Each of the first elongated flexible substrate portion 502 and the second elongated flexible substrate portion 504 may be formed, e.g., from a flexible plastic ribbon, such as a polyimide ribbon (e.g., poly (4,4'-oxydiphenylene-pyromellitimide)). The first elongated flexible substrate portion 502 may be bonded to the second elongated flexible substrate portion 504. The thickness of the substrate portions 502 and 504 may be, e.g., between about 10 µm to about 500 µm, including thicknesses such as 20 µm, 50 µm, 75 µm, and 100 µm, among others. The width of the elongated flexible substrate 202 may be, e.g., between about 1 mm to about 30 mm, including widths such as 10 mm, 15 mm, and 20 mm, among others. The length of the elongated flexible substrate portions 502 and 504 may be at least as long as is necessary to provide coupling between devices, systems and/or other wiring.

The first electrically conductive layer 508 and the second electrically conductive layer 510 may each correspond to electromagnetic shielding layers that shield the signal trace traces 506 from external signal noise. In some implementations, the flexible wiring 500 can be stacked together with one or more flexible wiring 500 to provide a stacked flexible wiring having an increase number of signal lines for transmitting control and/or data signals. As explained herein, the flexible wiring may be stacked together using an adhesive-based or adhesiveless laminate bonding technique. In some cases, the stacked flexible wiring can be formed using polymer encapsulants that are sprayed or painted on an initial elongated polymer substrate that includes the electrically conductive traces/shielding layer. For instance, in some cases, a flexible wiring such as wiring 500 can be sprayed or painted with an epoxy encapsulant (e.g., Stycast 2850FT) that is then cured to provide an additional polymer layer on which further electrically conductive materials may be deposited and patterned.

In some implementations, the flexible wiring 500 includes one or more vias 512 extending through the first elongated flexible substrate portion 502. The vias 512 may include an electrically conductive material (via contact 514) formed within the vias 512. The via contact 514 may include, e.g., a superconducting and/or non-superconducting metal, such as copper, aluminum, niobium, indium, or a copper alloy. In some cases, the via contact 514 is formed on the sidewalls of the via 512 but does not completely fill the via 512. In other cases, the via contact 514 completely fills the via 512, such that there is no continuous opening that extends through the via 512. In some implementations, the via contact 514 includes an adhesive layer formed to help the via contact 514 adhere to the sides of the via 512. For instance, the adhesive layer may include a film (e.g., between about 1 nm to about 1 micron thick, defined relative to the via sidewall) of copper or niobium. In some implementations, the material of the via contact 514 that is formed on the adhesive layer may include a film (e.g., between about 500 nm to about 20 micron thick, defined relative to the via sidewall) of copper or niobium.

The adhesive layer may be formed, e.g., by using electroless plating of the adhesive layer material (e.g., Cu) to establish a thin first adhesive layer, and then performing electroplating of the adhesive layer material (e.g., Cu) to establish a second adhesive layer on the first adhesive layer. Then, the remaining material (e.g., Al, Cu, or Nb) of the via contact 514 also may be formed on the adhesive layer using, e.g., electroplating. For example, aluminum may be plated (e.g., electroplated) on the adhesive layer. Other plating techniques may be used to plate the via contact 514 as well. For example, solvent based plating may be used to form a niobium via contact.

In some implementations, the via 512 extends from the first electrically conductive layer 508 to the signal trace 506 so that the via contact 514 connects the first electrically conductive layer 508 to the signal trace 506. In some implementations, the via 512 extends from the first electrically conductive layer 508 to the second electrically conductive layer 510 so that the via contact 514 connects the first electrically conductive layer 508 to the second electrically conductive layer 510. In some implementations, the via 512 extends from the second electrically conductive layer 510 to the signal trace 506 so that the via contact 514 connects the second electrically conductive layer 510 to the signal trace 506. The via 512 may be formed using laser drill technology.

In some implementations, the flexible wiring 500 has regions in which the signal trace 506 is exposed so that an electrical connection, such as a wire bond or bump bond may be made to the signal trace. Exposing the signal trace 506 may include removing parts of the first elongated flexible substrate portion 502 and/or removing parts of the second elongated flexible substrate portion 504 that cover the signal trace 506. In some cases, the length of the first elongated flexible substrate portion 502 and/or the second elongated flexible substrate portion 504 are not long enough to cover the entirety of the signal trace 506 such that a portion of the signal trace 506 is exposed.

An example of a technique for connecting flexible wiring to one another, to the quantum information processing system, and/or to circuit components is to use coaxial connectors, such as SMA connectors. However, coaxial connects can be bulky and therefore take up a lot of limited available space within the cryostat. Furthermore, the bulkiness of the coaxial connector also can render difficult making connections to the contacts of the high density flexible wiring. An alternative to coaxial connectors is to use a modified butt joint bond that employs wire bonding between contacts of the flexible wiring. FIG. 6 is a schematic that illustrates an example of a modified butt joint bond that employs wire bonding. In particular, FIG. 6 depicts a cross-section of a first flexible wiring 602 that is coupled to a second flexible wiring 604 using a modified butt joint bond. Each of first flexible wiring 602 and second flexible wiring 604 may have the same configuration as the flexible wiring 200 shown in FIG. 2. For example, flexible wiring 602 may include an elongated flexible substrate 606, multiple electrically conductive traces 608 (one trace 608 is shown in FIG. 6) arranged on a principal surface of the elongated flexible substrate 606, and an electrically conductive layer 610 on a second principal surface of the elongated flexible substrate 606. Similarly, flexible wiring 604 may include an elongated flexible substrate 612, multiple electrically conductive traces 614 (one trace 614 is shown in FIG. 6) arranged on a principal surface of the elongated flexible substrate 616, and an electrically conductive layer 616 on a second principal surface of the elongated flexible substrate 616. As in the flexible wiring 200 shown in FIG. 2, each conductive trace 608, 614 corresponds to an individual wire and multiple traces may be arranged in an array (e.g., along the Y-direction into and out of the page of FIG. 6). Additionally, the electrically conductive layers 610 and 616 can be electromagnetic shielding layers for shielding the conductive traces 608, 614, respectively, from crosstalk. Though both flexible wiring 602 and 604 are shown flat in FIG. 6, they can include fold regions, such as in flexible wiring 200, so that the layers 610, 616 can provide shielding for traces 608, 614.

First flexible wiring 602 is arranged with an edge 601 facing an edge 603 of second flexible wiring 604. Edge 601 may be separated from edge 603 by a relatively small distance 622 or touching one another. For example, distance 622 may be between about 25 microns to about several millimeters, such as 100 μm or 250 μm, among other distances. Wire bonds 618 are provided that may be used to electrically connect traces 608 of first flexible wiring 602 to traces 614 of second flexible wiring 604.

In some implementations, a solder bridge may be used instead of wire bonds to electrically connect traces 608 of first flexible wiring 602 to traces 614 of second flexible wiring 604. The distance 622 should be kept as small as possible to allow the solder bridge to form. Solder used to form the wire bonds 618 or solder bridge may be formed from a superconducting or non-superconducting material.

Both the edge 601 of the first flexible wiring 602 and the edge 603 of the second flexible wiring 604 may be cut using laser processing to provide more precise and relatively smooth edges. The edges 601 and 603 then may be placed closer together to provide a smaller bridge length for the solder bridge, which improves connection integrity and facilitates the bonding process.

In some implementations, the joint between the first flexible wiring 602 and the second flexible wiring 604 is fixed against a metal block to provide a mechanical connection for the first and second flexible wiring 602, 604, to provide an electrical connection between the first and second flexible wiring 602, 604, and/or to maintain the wiring at the temperature of the cryostat stage in which the wiring is arranged. For example, as shown in FIG. 6, a metal block 620 may be secured to and in thermal contact with the electromagnetic shielding layers 610, 616. In some implementations, the metal block 620 is clamped in place against the flexible wiring 602 and 604. Alternatively, or in addition, the metal block 620 is fixed to the shielding layers 610, 616 through an adhesive, such as solder. The metal block 620 may be formed from a material suitable for providing sufficient heat transfer within the cryostat, such as copper. In some implementations, the shielding layers 610, 616 double as grounding planes, and the metal block 620 provides a common ground.

Figure 7A:
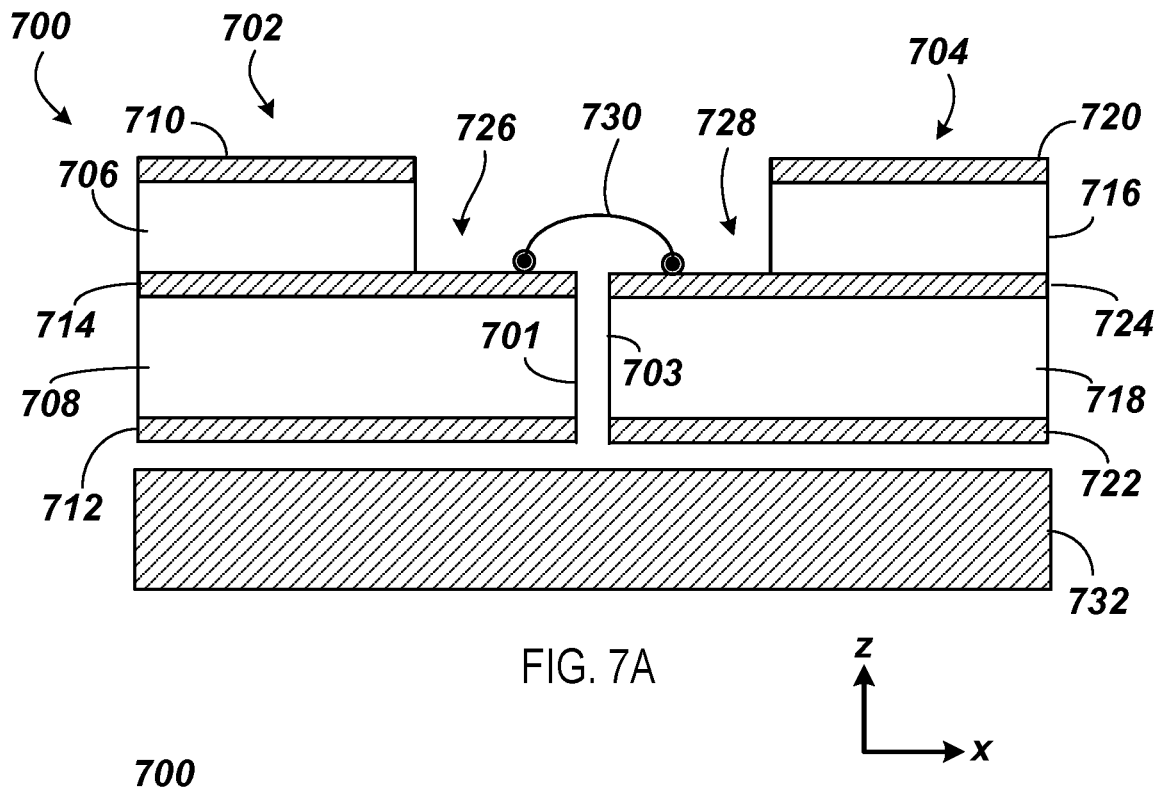
FIG. 7A is a schematic that illustrates an example of a modified butt joint bond for flexible wiring.

FIG. 6 illustrates a modified butt joint for flexible wiring having the configuration provided as shown in FIG. 2. In some implementations, a modified butt joint also may be used for flexible wiring having the configuration shown in FIG. 5. For example, FIG. 7A is a schematic illustrating a cross-section of a first flexible wiring 702 that is coupled to a second flexible wiring 704 using the modified butt joint. Each of the first flexible wiring 702 and the second flexible wiring 704 has the same stripline configuration as the flexible wiring 500 shown in FIG. 5. For example, flexible wiring 702 may include a first elongated flexible substrate portion 706, a second elongated flexible substrate portion 708, a signal trace 714 arranged between portions 706 and 708, a first electrically conductive layer 710 on a top surface of substrate portion 706, and a second electrically conductive layer 712 on a bottom surface of substrate portion 708. Similarly, flexible wiring 704 may include a first elongated flexible substrate portion 716, a second elongated flexible substrate portion 718, a signal trace 724 arranged between portions 716 and 718, a first electrically conductive layer 720 on a top surface of substrate portion 716, and a second electrically conductive layer 722 on a bottom surface of substrate portion 718. As in the flexible wiring 500 shown in FIG. 5, each signal trace 714, 724 corresponds to an individual wire and multiple traces may be arranged in an array (e.g., along the Y-direction into and out of the page of FIG. 7A). Additionally, the electrically conductive layers 710, 712, 720, 722 can be electromagnetic shielding layers for shielding the signal traces 714, 724 from crosstalk.

First flexible wiring 702 is arranged with an edge 701 facing an edge 703 of second flexible wiring 704. Edge 701 may be separated from edge 703 by a relatively small distance or touching one another. For example, edge 701 may be separated from edge 703 by a distance between about 25 microns to about several millimeters, such as 100 μm or 250 μm among other distances. Wire bonds 730 are provided that may be used to electrically connect traces 714 of first flexible wiring 702 to traces 724 of second flexible wiring 704. In some implementations, a solder bridge may be used instead of wire bonds to connect traces 714 of first flexible wiring 702 to traces 724 of second flexible wiring 704. The distance between the first edge 701 and the second edge 703 should be kept as small as possible to allow the solder bridge to form. Both the edge 701 of the first flexible wiring 702 and the edge 703 of the second flexible wiring 704 may be cut using laser processing to provide more precise and relatively smooth edges. The edges 701 and 703 then may be placed closer together to provide a smaller bridge length for the solder bridge, which improves connection integrity and facilitates the bonding process. Solder used to form the wire bonds 730 or solder bridge may be formed from a superconducting or non-superconducting material.

Figure 7B:
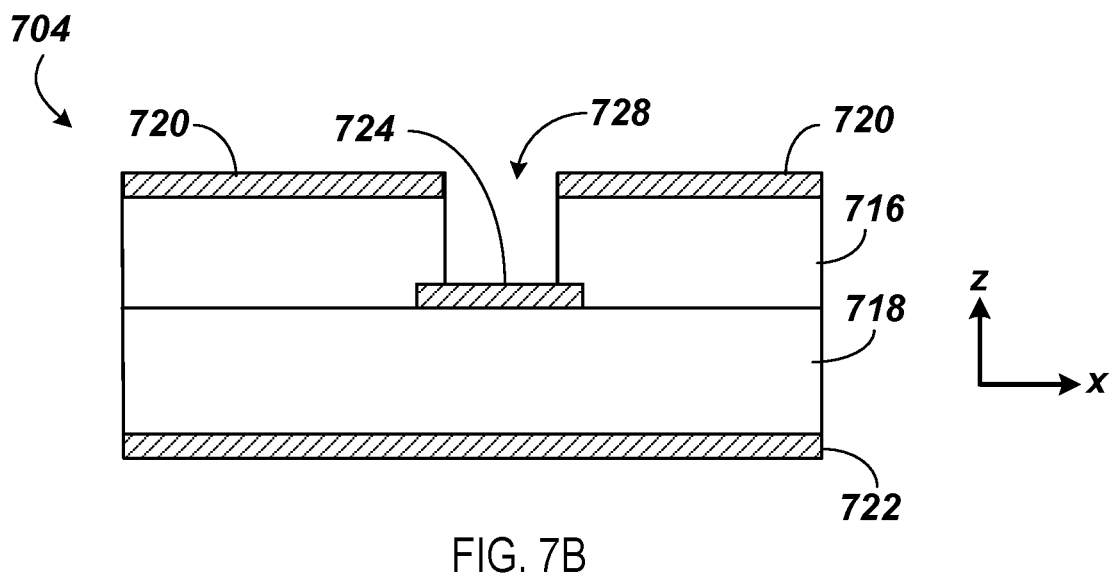
FIG. 7B illustrates a side view of flexible wiring shown in FIG. 7A.

In some implementations, first flexible wiring 702 may include a region 726 in which the substrate portion 706 is removed or is absent to expose a section of signal trace 714. Similarly, second flexible wiring 704 may include a region 728 in which the substrate portion 716 is removed or is absent to expose a section of signal trace 724. By exposing the signal traces in regions 726, 728, the signal traces 726, 728 can be accessed to form the wired bond or solder bridge bond. FIG. 7B is a schematic that illustrates a side view of edge 703 and region 728 of second flexible wiring 704 from FIG. 7A. As shown in FIG. 7B, only a section of substrate portion 716 directly above signal trace needs to be removed or absent to form region 728 and expose the signal trace 724. Substrate portion 716 to the left and to the right of the region 728 may be left in place to bond to substrate portion 718 and to provide a support surface for conductive layer 720. In some implementations, regions 726, 728 include the solder that forms the electrical connection between the first flexible wiring 702 and the second flexible wiring 704.

In some implementations, the joint between the first flexible wiring 702 and the second flexible wiring 704 is secured to and in thermal contact with a metal block to provide a mechanical connection between first and second flexible wiring 702, 704, to provide an electrical connection between first and second flexible wiring 702, 704, and/or to maintain the wiring at the temperature of the cryostat stage in which the wiring is arranged. For example, as shown in FIG. 7A, a metal block 732 may be positioned against electromagnetic shielding layers 712, 722. In some implementations, the metal block 732 is clamped in place against the flexible wiring 702 and 704. Alternatively, or in addition, the metal block 732 is fixed to the shielding layers 712, 722 through an adhesive, such as solder. Alternatively, or in addition, an additional metal block is secured to and in thermal contact with the shielding layers 710, 720. The additional metal block also may be fixed to shielding layers 710, 720 through an adhesive, such as solder. The metal blocks may be formed from a material suitable for providing sufficient heat transfer within the cryostat, such as copper. In some implementations, the shielding layers 712, 722 double as grounding planes, and the metal block 732 provides a common ground. Similarly, the shielding layers 710, 720 may double as grounding planes to which the additional metal block provides a common ground.

In some implementations, the joint between a first flexible wiring and a second flexible wiring may be provided at a boundary within a cryostat that separates one temperature stage of the cryostat held at a first temperature and a second temperature stage of the cryostat held at a second different temperature from the first stage. For example, the joint may connect a first flexible wiring, such as first flexible wiring 602 or 702, within a temperature stage held to a temperature below 3 K (e.g., stage 103 in FIG. 1), to a second flexible wiring, such as second flexible wiring 604 or 704, within a temperature stage held to a temperature above 3 K but below room temperature (e.g., stage 101 in FIG. 1). In some implementations, the flexible wiring at a transition between different temperature stages within a cryostat or at a transition from a vacuum environment to another vacuum environment or to a non-vacuum environment may be sealed at the transition using an epoxy adhesive fixed to the flexible wiring and to a clamp device (e.g., a metal ring such as a copper ring).

Various approaches may be used to fabricate the flexible wiring as disclosed herein. For example, in some implementations, the flexible wiring may be constructed by providing a large substrate (e.g., a flexible plastic substrate, such as polyimide) on which the metals and/or superconducting films are formed. The substrate may include, for example, a large sheet that is greater than 8" on a side, e.g., 12" by 14". For depositing a metal/superconducting film, the substrate may be placed in a vacuum chamber. Prior to depositing any films, the substrate surface may be cleaned, e.g., by performing an ion cleaning (e.g., an Ar ion cleaning). In the case a bi-layer film is formed on the substrate, a first layer of material is blanket deposited on the substrate. The first layer may include, e.g., a superconductor film, such as niobium that is deposited using sputtering. Alternatively, the first layer may include a non-superconducting film such as copper. The first layer may be deposited to have a thickness up to about 5 μm. For example, the first layer may be deposited to have a thickness of 100 nm, 250 nm, 500 nm, 750 nm, 1 μm, or 2 μm, among other thicknesses. A second layer then is blanket deposited (e.g., sputtered or electroless plating) on the first layer. The second layer may include a non-superconducting film, such as copper, or a superconducting film such as niobium or aluminum. The second layer may be deposited to have a thickness up to about 20 μm. For example, the second layer may be deposited to have a thickness of 100 nm, 250 nm, 500 nm, 750 nm or 1 μm. In some cases, a first deposited portion of the second layer serves as a base layer for a later electroplating step. For example, a thin 100 nm film of copper may be deposited after which a thicker layer of copper is electroplated. In some implementations, the films are deposited on both a top and bottom side of the substrate. The deposited films then may be patterned (e.g., using etching or lift-off processes) to form the desired circuit pattern. In some cases for a bi-layer film, an identical pattern is transferred to both the first layer and the second layer during the patterning step. In other cases, a different pattern is formed for the first layer then for the second layer in the patterning step. In some implementations, via holes are formed within the substrate using a laser etch process. The via holes may then be filled with via contact material (e.g., copper and/or a superconducting material) to form the via contacts. Once patterned, the substrate sheet may be partitioned into individual flexible wiring. Partitioning the substrate sheet may entail performing laser cutting on the substrate sheet or using a blade to mechanically cut the substrate sheet. In some implementations, partitioning the substrate sheet results in a finalized flexible wiring. Alternatively, in some implementations, the partitioned substrate sheets may be stacked together to form a stacked flexible wiring (e.g., a stack of multiple flexible wiring 200), to form a stripline configuration (e.g., flexible wiring 500), or to form a stacked stripline flexible wiring. Stacking the partitioned substrate sheets may entail introducing an adhesive between the substrate that is cured so that the stacked substrates are bonded together. Alternatively, the partitioned substrate sheets may be bonded together using adhesiveless bonding techniques. After obtaining the stacked flexible wiring, further processing may be performed if necessary. For example, additional via contacts may be formed within one or more of the stacked substrates to provide connections to conductive traces on the stacked flexible wiring.

In some implementations, the flexible wiring may be constructed using an extrusion and roll process. For example, a first elongated sheet of superconducting or non-superconducting material (e.g., a 0.25" thick sheet of niobium, aluminum or copper) may be provided. In some cases, a second elongated sheet of superconducting or non-superconducting material (e.g., a 0.25" thick sheet of niobium, aluminum or copper) may be provided on top of the first elongated sheet. If just a single sheet is provided, the single sheet of material is passed through an extrusion machine that thins the sheet (e.g., to a thickness of between about 20 microns to about 10 mm). If a bi-layer is provided, the first and second elongated sheets then may be pressed together under vacuum and/or heat and passed through the extrusion machine that thins the bi-layer sheet (e.g., to a thickness of between about 20 microns to about 10 mm) and causes the materials in the bi-layer sheet to adhere together. The thinned single layer or bi-layer sheet then may be laminated with a polyimide substrate. In some implementations, a thinned single layer or bi-layer sheet is laminated on both sides of the polyimide substrate. As explained herein, superconducting and/or non-superconducting films on the polyimide substrate may be patterned (e.g., using etching processes) to form the desired circuit pattern. In some cases, for a bi-layer film, an identical pattern is transferred to both the first layer and the second layer during the patterning step. In other cases, a different pattern is formed for the first layer then for the second layer in the patterning step. In some implementations, via holes are formed within the substrate using a laser etch process. The via holes may then be filled with via contact material (e.g., copper and/or a superconducting material) to form the via contacts. Once patterned, the substrate sheet including the patterned films may be partitioned into individual flexible wiring. Partitioning the substrate sheet may entail performing laser cutting on the substrate sheet or using a blade to mechanically cut the substrate sheet. In some implementations, partitioning the substrate sheet results in a finalized flexible wiring. Alternatively, in some implementations, the partitioned substrate sheets may be stacked together to form a stacked flexible wiring (e.g., a stack of multiple flexible wiring 200), to form a stripline configuration (e.g., flexible wiring 500), or to form a stacked stripline flexible wiring. Stacking the partitioned substrate sheets may entail introducing an adhesive between the substrate that is cured so that the stacked substrates are bonded together. Alternatively, the partitioned substrate sheets may be bonded together using adhesiveless bonding techniques. After obtaining the stacked flexible wiring, further processing may be performed if necessary. For example, addition via contact may be formed within one or more of the stacked substrates to provide connections to conductive traces on the stacked flexible wiring.

Implementations of the quantum subject matter and quantum operations described in this specification can be implemented in suitable quantum circuitry or, more generally, quantum computational systems, also referred to as quantum information processing systems, including the structures disclosed in this specification and their structural equivalents, or in combinations of one or more of them. The terms "quantum computational systems" and "quantum information processing systems" may include, but are not limited to, quantum computers, quantum cryptography systems, topological quantum computers, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In some implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements (also referred to as quantum computing circuit elements) include circuit elements for performing quantum processing operations. That is, the quantum circuit elements are configured to make use of quantum-mechanical phenomena, such as superposition and entanglement, to perform operations on data in a non-deterministic manner. Certain quantum circuit elements, such as qubits, can be configured to represent and operate on information in more than one state simultaneously. Examples of superconducting quantum circuit elements include circuit elements such as quantum LC oscillators, qubits (e.g., flux qubits, phase qubits, or charge qubits), and superconducting quantum interference devices (SQUIDs) (e.g., RF-SQUID or DC-SQUID), among others.

In contrast, classical circuit elements generally process data in a deterministic manner. Classical circuit elements can be configured to collectively carry out instructions of a computer program by performing basic arithmetical, logical, and/or input/output operations on data, in which the data is represented in analog or digital form. In some implementations, classical circuit elements can be used to transmit data to and/or receive data from the quantum circuit elements through electrical or electromagnetic connections. Examples of classical circuit elements include circuit elements based on CMOS circuitry, rapid single flux quantum (RSFQ) devices, reciprocal quantum logic (RQL) devices and ERSFQ devices, which are an energy-efficient version of RSFQ that does not use bias resistors.

Fabrication of the quantum circuit elements and classical circuit elements described herein can entail the deposition of one or more materials, such as superconductors, dielectrics and/or metals. Depending on the selected material, these materials can be deposited using deposition processes such as chemical vapor deposition, physical vapor deposition (e.g., evaporation or sputtering), or epitaxial techniques, among other deposition processes. Processes for fabricating circuit elements described herein can entail the removal of one or more materials from a device during fabrication. Depending on the material to be removed, the removal process can include, e.g., wet etching techniques, dry etching techniques, or lift-off processes. The materials forming the circuit elements described herein can be patterned using known lithographic techniques (e.g., photolithography or e-beam lithography).

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties. A superconductor (alternatively superconducting) material can be understood as material that exhibits superconducting properties at or below a superconducting critical temperature. Examples of superconducting material include aluminum (superconductive critical temperature of about 1.2 kelvin), indium (superconducting critical temperature of about 3.4 kelvin), NbTi (superconducting critical temperature of about 10 kelvin) and niobium (superconducting critical temperature of about 9.3 kelvin). Accordingly, superconducting structures, such as superconducting traces and superconducting ground planes, are formed from material that exhibits superconducting properties at or below a superconducting critical temperature.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the implementations described above should not be understood as requiring such separation in all implementations.

A number of implementations have been described. Nevertheless, it will be understood that various modifications may be made without departing from the spirit and scope of the invention. Accordingly, other implementations are within the scope of the following claims.

What is claimed is:

1. Flexible wiring comprising:
an elongated flexible substrate;
a plurality of electrically conductive traces arranged in an array on a first side of the elongated flexible substrate; and
an electromagnetic shielding layer on a second side of the elongated flexible substrate, the second side being opposite the first side,
wherein the elongated flexible substrate comprises a fold region between a first electronically conductive trace and a second electrically conductive trace such that the electromagnetic shielding layer provides electromagnetic shielding between the first electronically conductive trace and the second electrically conductive trace,
wherein at least one electrically conductive trace of the plurality of electrically conductive traces comprises a bi-layer, the bi-layer comprising a superconductor layer and a metal layer on the superconductor layer.

2. The flexible wiring of claim 1, wherein the fold region comprises a raised band in the flexible substrate, and a length of the raised band extends parallel to a length of the first electrically conductive trace and the second electrically conductive trace.

3. The flexible wiring of claim 1, comprising a first elongated groove in the fold region, and a length of the first elongated groove runs parallel to a length of the first electrically conductive trace and a length of the second electrically conductive trace.

4. The flexible wiring of claim 3, wherein the first elongated groove extends into the first side or into the second side of the elongated flexible substrate.

5. The flexible wiring of claim 3, comprising a second elongated groove in the fold region,
a length of the second elongated groove runs parallel to the length of the first electrically conductive trace and the length of the second electrically conductive trace, and the first elongated groove is on the first side of the substrate and the second elongated groove is on the second side of the substrate.

6. The flexible wiring of claim 3, wherein the first elongated groove extends into the electromagnetic shielding layer.

7. The flexible wiring of claim 6, wherein the first elongated groove extends into the elongated flexible substrate.

8. The flexible wiring of claim 1, wherein the superconductor layer comprises niobium or NbTi.

9. The flexible wiring of claim 1, wherein the metal layer comprises copper or a copper alloy.

10. The flexible wiring of claim 1, wherein the electromagnetic shielding layer comprises a shielding bi-layer.

11. The flexible wiring of claim 10, wherein the shielding bi-layer comprises a niobium layer.

12. The flexible wiring of claim 10, wherein the shielding bi-layer comprises a copper layer or a copper alloy layer.

13. The flexible wiring of claim 1, wherein the electromagnetic shielding layer comprises a plurality of microstrips having lengths oriented orthogonally with respect to the lengths of the plurality of electrically conductive traces.

14. A flexible wiring comprising:
a first elongated flexible layer;
a second elongated flexible layer bonded to the first elongated flexible layer;
a plurality of electrically conductive traces arranged at a bond interface between the first elongated flexible layer and the second elongated flexible layer;
a first electromagnetic shielding layer on a principal surface of the first elongated flexible layer;
a second electromagnetic shielding layer on a principal surface of the second elongated flexible layer; and
a via extending through the first elongated flexible layer, wherein the via comprises a superconductor via contact.

15. The flexible wiring of claim 14, wherein the via comprises an adhesive layer, the superconductor via contact being formed on the adhesive layer.

16. The flexible wiring of claim 14, wherein the via extends from the first electromagnetic shielding layer to at least one electrically conductive trace of the plurality of electrically conductive traces, and the superconductor via contact is connected to the first electromagnetic shielding layer and the at least one electrically conductive trace.

17. The flexible wiring of claim 14, wherein the via extends from the first electromagnetic shielding layer to the second electromagnetic shielding layer, and the superconductor via contact is connected to the first electromagnetic shielding layer and at least one electrically conductive trace of the plurality of electrically conductive traces.

18. A device comprising:
a first flexible wiring comprising a first elongated flexible substrate, a first plurality of electrically conductive traces arranged in an array on a first side of the first elongated flexible substrate, and a first electromagnetic shielding layer on a second side of the first elongated flexible substrate, the second side of the first elongated flexible substrate being opposite the first side of the first elongated flexible substrate;

a second flexible wiring comprising a second elongated flexible substrate, a second plurality of electrically conductive traces arranged in an array on a first side of the second elongated flexible substrate, and a second electromagnetic shielding layer on a second side of the second elongated flexible substrate, the second side of the second elongated flexible substrate being opposite the first side of the second elongated flexible substrate, wherein the first flexible wiring is coupled to the second flexible wiring through a butt joint.

19. The device of claim 18, wherein the butt joint comprises a wire bond that connects a first electrically conductive trace from the first plurality of electrically conductive traces to a first electrically conductive trace from the second plurality of electrically conductive traces.

20. The device of claim 18, wherein the butt joint comprises a solder bridge that connects a first electrically conductive trace from the first plurality of electrically conductive traces to a first electrically conductive trace from the second plurality of electrically conductive traces.

21. The device of claim 18 further comprising a metal block secured to and in thermal contact with the first electromagnetic shielding layer and to the second electromagnetic shielding layer.

22. A device comprising:
a first flexible wiring comprising a first elongated flexible substrate, a first plurality of electrically conductive traces arranged at a bond interface within the first elongated flexible substrate, a first electromagnetic shielding layer on a first principal surface of the first elongated flexible substrate, and a second electromagnetic shielding layer on a second principal surface of the first elongated flexible substrate;

a second flexible wiring comprising a second elongated flexible substrate, a second plurality of electrically conductive traces arranged at a bond interface within the second elongated flexible substrate, a third electromagnetic shielding layer on a first principal surface of the second elongated flexible substrate, and a fourth electromagnetic shielding layer on a second principal surface of the second elongated flexible substrate, wherein the first flexible wiring is electrically coupled to the second flexible wiring through a butt joint.

23. The device of claim 22, wherein the first elongated flexible substrate comprises a first cavity through which a first electrically conductive trace of the first plurality of electrically conductive traces is exposed, and the second elongated flexible substrate comprises a second cavity through a first electrically conductive trace of the second plurality of electrically conductive traces is exposed.

24. The device of claim 23, wherein the butt joint comprises a wire bond that connects the exposed first electrically conductive trace of the first plurality of electrically conductive traces to the exposed first electrically conductive trace of the second plurality of electrically conductive traces.

25. The device of claim 23, wherein the butt joint comprises a solder bridge that connects the exposed first electrically conductive trace of the first plurality of electrically conductive traces to the exposed first electrically conductive trace of the second plurality of electrically conductive traces.

26. The device of claim 23, further comprising a first metal block secured to and in thermal contact with the first electromagnetic shielding layer and to the third electromagnetic shielding layer.

27. The device of claim 26, further comprising a second metal block secured to and in thermal contact with the second electromagnetic shielding layer and to the fourth electromagnetic shielding layer.

28. A system comprising:
a cryostat comprising a first stage configured to be held within a first temperature range;
a quantum information processing system within the first stage; and
flexible wiring within the first stage and coupled to the quantum information processing system, wherein the flexible wiring comprises
an elongated flexible substrate,
a plurality of electrically conductive traces arranged in an array on a first side of the elongated flexible substrate, and
an electromagnetic shielding layer on a second side of the elongated flexible substrate, the second side being opposite the first side,
wherein the elongated flexible substrate comprises a fold region between a first electronically conductive trace and a second electrically conductive trace such that the electromagnetic shielding layer provides electromagnetic shielding between the first electronically conductive trace and the second electrically conductive trace.

29. A system comprising:
a cryostat comprising a first stage configured to be held within a first temperature range;
a quantum information processing system within the first stage; and
flexible wiring within the first stage and coupled to the quantum information processing system, wherein the flexible wiring comprises
a first elongated flexible layer;
a second elongated flexible layer bonded to the first elongated flexible layer;
a plurality of electrically conductive traces arranged at a bond interface between the first elongated flexible layer and the second elongated flexible layer;
a first electromagnetic shielding layer on a principal surface of the first elongated flexible layer;
a second electromagnetic shielding layer on a principal surface of the second elongated flexible layer; and
a via extending through the first elongated flexible layer, wherein the via comprises a superconductor via contact.

* * * * *

UNITED STATES PATENT AND TRADEMARK OFFICE
CERTIFICATE OF CORRECTION

| | | |
|---|---|---|
| PATENT NO. | : 11,557,709 B2 | Page 1 of 1 |
| APPLICATION NO. | : 16/616733 | |
| DATED | : January 17, 2023 | |
| INVENTOR(S) | : Martinis | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 420 days.

Signed and Sealed this
Fourteenth Day of January, 2025

Derrick Brent
*Acting Director of the United States Patent and Trademark Office*